US006282038B1

(12) United States Patent
Bonaccio et al.

(10) Patent No.: US 6,282,038 B1
(45) Date of Patent: Aug. 28, 2001

(54) VARIABLE GAIN AMPLIFIER WITH TEMPERATURE COMPENSATION FOR USE IN A DISK DRIVE SYSTEM

(75) Inventors: Anthony Richard Bonaccio, Shelburne, VT (US); Rick Allen Philpott; Peter John Windler, both of Rochester, MN (US); Gregory Scott Winn, Fort Collins, CO (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/253,122

(22) Filed: Feb. 19, 1999

(51) Int. Cl.⁷ ........................................................ G11B 5/09
(52) U.S. Cl. .............................. 360/46; 360/67; 330/256
(58) Field of Search ................................. 360/46, 67, 68, 360/31, 97.02; 330/254, 256, 278, 143; 375/345

(56) References Cited

U.S. PATENT DOCUMENTS

| | | |
|---|---|---|
| 4,750,058 | 6/1988 | Hirt et al. . |
| 5,162,678 | 11/1992 | Yamasaki . |
| 5,321,559 | 6/1994 | Nguyen et al. . |
| 5,375,145 | 12/1994 | Abbott et al. . |
| 5,442,492 | 8/1995 | Cunningham et al. . |
| 5,463,603 | 10/1995 | Petersen . |
| 5,491,447 | 2/1996 | Goetschel et al. . |
| 5,519,548 | 5/1996 | Liepe et al. . |
| 5,572,163 | 11/1996 | Kimura et al. . |
| 5,631,891 | 5/1997 | Moritsugu et al. . |
| 5,732,055 * | 3/1998 | Masaki et al. ................. 369/54 |
| 5,831,781 | 11/1998 | Okamura . |
| 6,078,455 * | 6/2000 | Enarson et al. ................ 360/68 |
| 6,124,998 * | 9/2000 | Kanegae .......................... 360/68 |

FOREIGN PATENT DOCUMENTS

| | | |
|---|---|---|
| 0521653A2 | 1/1993 | (EP) . |
| 0 521 653 A2 | 7/1993 | (EP) . |

OTHER PUBLICATIONS

"Automatic Gain Control with Equalizer", IBM Technical Disclosure Bulletin, vol. 21, No.9, pp. 3569–3570, Feb. 1979.

* cited by examiner

Primary Examiner—Alan T. Faber
(74) Attorney, Agent, or Firm—Mark A. Hollingsworth

(57) ABSTRACT

An apparatus and method for estimating an amplitude of a readback signal obtained from a data storage medium and input to a gain modifying amplifier involves sensing an amplifier output signal in response to a readback signal applied to the amplifier. An amplifier control signal is produced which is representative of a difference between the amplifier output signal and a reference signal. A compensation signal associated with a temperature coefficient of amplifier gain is generated, and an estimate signal indicative of the amplitude of the readback signal is produced using the compensation signal. The estimate signal is representative of readback signal amplitude when the estimate signal has a magnitude equivalent to that of the difference signal and a polarity opposite that of the difference signal. Generating the compensation signal may further involve generating a first compensation signal having a magnitude proportional to absolute temperature and generating a second compensation signal having a magnitude independent of temperature. The first and second compensation signals may be selectively used to cancel temperature related gain and polarity variations in the amplifier control signal. A circuit for estimating an amplitude of a readback signal includes a variable gain amplifier, a temperature compensation circuit, and a comparator, all of which have an equivalent temperature profile and are provided on a common IC substrate. The circuit, which further includes an N-bit DAC and a logic circuit, may be implemented in a disk drive system.

31 Claims, 7 Drawing Sheets

VARIABLE GAIN AMPLIFIER WITH TEMPERATURE COMPENSATION FOR USE IN A DISK DRIVE SYSTEM

FIELD OF THE INVENTION

The present invention relates generally to signals read from a data storage medium and, more particularly, to a system and method for estimating an amplitude of a signal read from a data storage medium provided in a disk drive system.

BACKGROUND OF THE INVENTION

Within the disk drive system manufacturing industry, much attention is presently being focused on the performance and reliability of transducers utilized as part of the read/write head. Changes in the operating characteristics of a read transducer, for example, may be indicative of read/write head performance degradation or impending failure of the head. Changes in the amplitude of a readback signal obtained from a particular read/write head, for example, may indicate a possible problem with the read element of that read/write head.

It has been found, for example, that monitoring the amplitude characteristics of a readback signal obtained using a particular read/write head over time may provide insight as to the integrity and operating condition of the read transducer provided on the read/write head. A giant MR (GMR) transducer that is operating in an anomalous manner, by way of example, may produce readback signals of decreasing amplitude over time. The nature and complexity of most read channel designs, however, generally preclude in-situ determination of readback signal characteristics, such as determining, with a high degree of accuracy, readback signal amplitude for a particular read/write head over time.

In a typical read channel design, a variable gain amplifier (VGA) is often employed as the gain element of an automatic gain control (AGC) loop which is used to regulate the amplitude of readback signals provided at the output of the VGA. The AGC loop modifies the gain of the VGA by applying appropriate control signals to the VGA. Although attempts have been made to use VGA control signals for purposes of estimating the amplitude of readback signals input to the VGA, such attempted implementations wholly ignore temperature related factors that adversely affect the accuracy of readback signal amplitude estimates.

There exists a keenly felt need in the disk drive system manufacturing community for an apparatus and method for determining the amplitude of a readback signal obtained from a data storage medium with a high degree of accuracy. There exists a particular need for such an apparatus and method that may be implemented in-situ a read channel. The present invention fulfills these and other needs.

SUMMARY OF THE INVENTION

The present invention is directed to an apparatus and method for estimating an amplitude of a readback signal obtained from a data storage medium and input to a gain modifying amplifier. A method according to the present invention involves sensing an output signal at an output of the amplifier in response to a readback signal applied to an input of the amplifier. A difference signal is produced which is representative of a difference between the amplifier output signal and a reference signal. A compensation signal associated with a temperature coefficient of amplifier gain is generated, and an estimate signal indicative of the amplitude of the readback signal is produced using the compensation signal. The estimate signal is representative of readback signal amplitude when the estimate signal has a magnitude equivalent to that of the difference signal and a polarity opposite that of the difference signal.

Producing the estimate signal may involve adding the estimate signal to the difference signal or subtracting the estimate signal from the difference signal. The reference signal may be representative of a preestablished readback signal amplitude to be maintained at the output of the gain modifying amplifier. The compensation signal has a magnitude which is related to temperature, and is preferably proportional to absolute temperature. Generating the compensation signal may further involve generating a first compensation signal having a magnitude proportional to absolute temperature and generating a second compensation signal having a magnitude independent of temperature. The first and second compensation signals may be selectively used to cancel temperature related gain and polarity variations in the difference signal.

The estimate signal may be a binary estimate signal, and the compensation signal may be a current signal. The difference signal may be applied to a control input of the amplifier so as to equilibrate the amplifier output signal with the reference signal so as to maintain the signal output from the gain modifying amplifier at a predetermined amplitude.

A circuit for estimating an amplitude of a readback signal obtained from a data storage medium includes a gain modifying amplifier having a signal input that receives the readback signal, a signal output, and control inputs that receive an amplifier control signal. The control inputs of the amplifier are coupled to a capacitor, and the amplifier control signal is stored in the capacitor.

The circuit further includes a comparator having inputs coupled to the control inputs of the amplifier via respective resistive elements. A digital-to-analog circuit (DAC) has outputs coupled to the comparator inputs. A temperature compensation circuit is coupled to the comparator inputs and generates a compensation signal associated with a temperature coefficient of amplifier gain. The temperature compensation signal causes a change in voltage across the resistive elements. A logic circuit includes an input coupled to the output of the comparator and an output coupled to an input of the DAC. The logic circuit produces at its output an estimate signal indicative of the amplitude of the readback signal in response to equivalency of voltages at the respective inputs of the comparator. The estimate signal may be a binary signal.

The amplifier, temperature compensation circuit, and comparator preferably have an equivalent temperature profile, and are preferably provided on a common IC substrate. The temperature compensation circuit comprises a current generator and a magnitude control. The temperature compensation circuit may be integral to the amplifier. The gain modifying amplifier may comprise a variable gain amplifier (VGA).

The temperature compensation circuit may generate a first compensation signal having a magnitude proportional to absolute temperature and generate a second compensation signal having a magnitude independent of temperature. The first compensation signal may have a polarity opposite that of the second compensation signal. The first and second compensation signals may be selectively used to cancel temperature related gain and polarity variations in the amplifier control signal. A readback signal amplitude estimating circuit of the present invention may be implemented in a disk drive system or various other types of data storage systems.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

Figure 1:
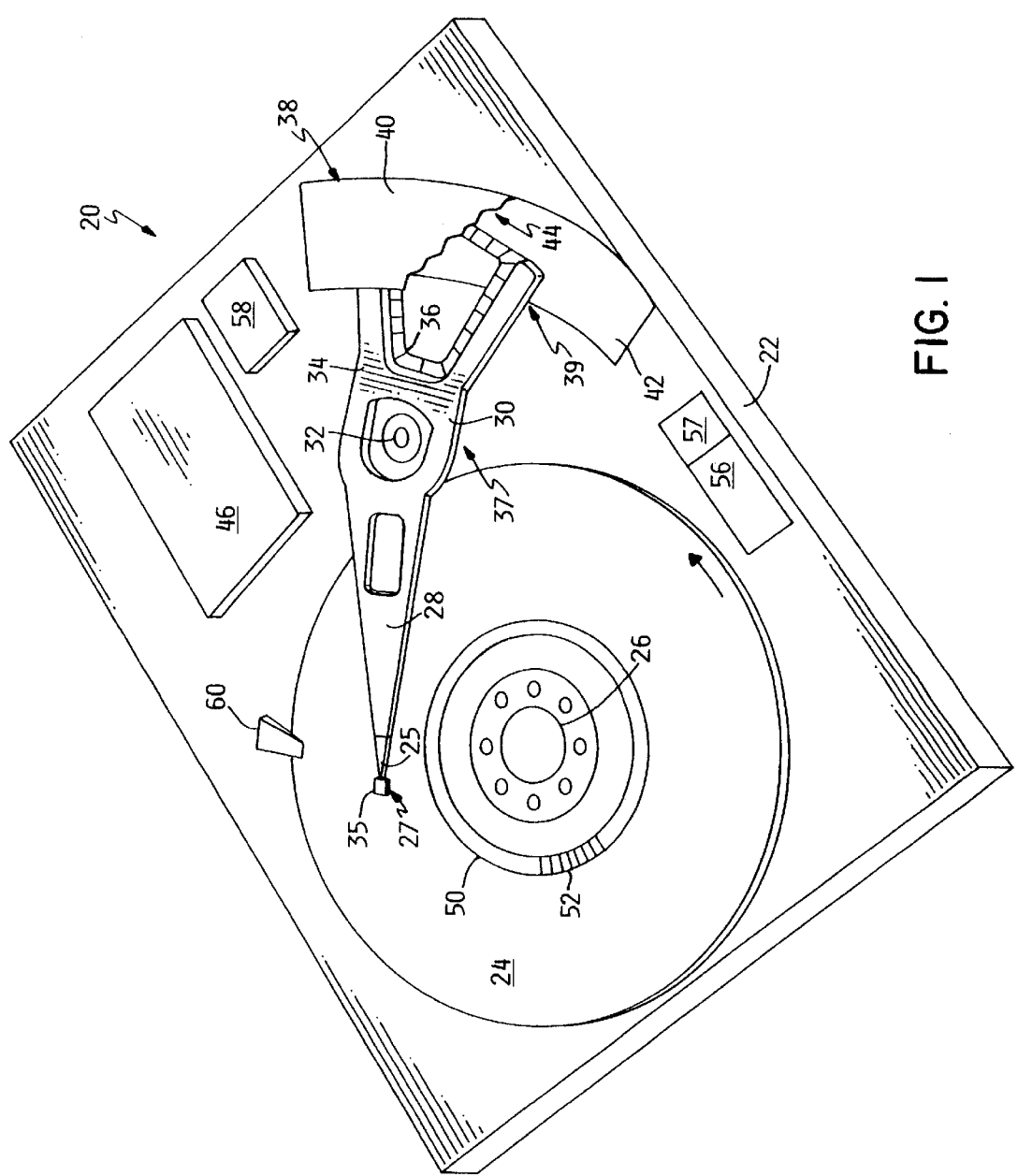
FIG. 1 is a top perspective view of a disk drive system with its upper housing cover removed.

While the invention is amenable to various modifications and alternative forms, specifics thereof have been shown by way of example in the drawings and will be described in detail hereinbelow. It is to be understood, however, that the intention is not to limit the invention to the particular embodiments described. On the contrary, the invention is intended to cover all modifications, equivalents, and alternatives falling within the scope of the invention as defined by the appended claims.

DETAILED DESCRIPTION OF VARIOUS EMBODIMENTS

In the following description of the illustrated embodiments, references are made to the accompanying drawings which form a part hereof, and in which is shown by way of illustration, various embodiments in which the invention may be practiced. It is to be understood that other embodiments may be utilized, and structural and functional changes may be made without departing from the scope of the present invention.

In broad and general terms, a system and methodology in accordance with the principles of the present invention provide for the accurate estimation of the amplitude of an input signal to an automatic gain control (AGC) loop. An input signal estimation approach according to the present invention provides for accurately estimating the amplitude of an input signal, notwithstanding the presence of variations in the amplitude of the input signal. Temperature compensation is provided, by which a temperature coefficient associated with the gain of a variable gain amplifier employed in the AGC loop is used to produce a temperature compensation signal which is added to the VGA control signal so as to effectively nullify temperature variation effects on AGC loop gain.

In an embodiment in which an input signal estimation methodology according to the present invention is employed in a disk drive system, the amplitude of a readback signal obtained from a data storage medium may be accurately estimated. Estimating the readback signal amplitude for a given read/write head on a repeated basis provides for the identification of changes in the amplitude characteristics of a read transducer and/or read channel circuitry.

By way of example, amplitude measurements which result in reduced amplitude values associated with a GMR read transducer are typically indicative of impending failure of the transducer. Such losses or deviations in relative readback signal amplitude may be used as part of a predictive failure analysis strategy for read transducers of varying types. It can be appreciated that increasing the accuracy of readback signal amplitude estimates advantageously improves the ability to detect undesirable changes in read transducer/read channel performance, and increases the accuracy of properly identifying a poor performing read transducer.

In an embodiment in which the amplitude of a readback signal is to be maintained at a preestablished amplitude, readback signal amplitude estimation circuitry of the present invention, which includes a variable gain amplifier and temperature compensation circuitry, may be employed within an automatic gain control loop of the read channel circuitry. The amplitude of a readback signal may be estimated with a high degree of accuracy, even where the signal obtained from the storage medium and input to the variable gain amplifier is subject to amplitude variations, such as due to read/write head manufacturing variations, fly height variations, preamplifier gain variations, and the like. Accurately estimating the amplitude of a readback signal provides for the detection of subtle and pronounced changes in read transducer performance and/or undesirable changes in read channel circuitry performance.

Figure 2:
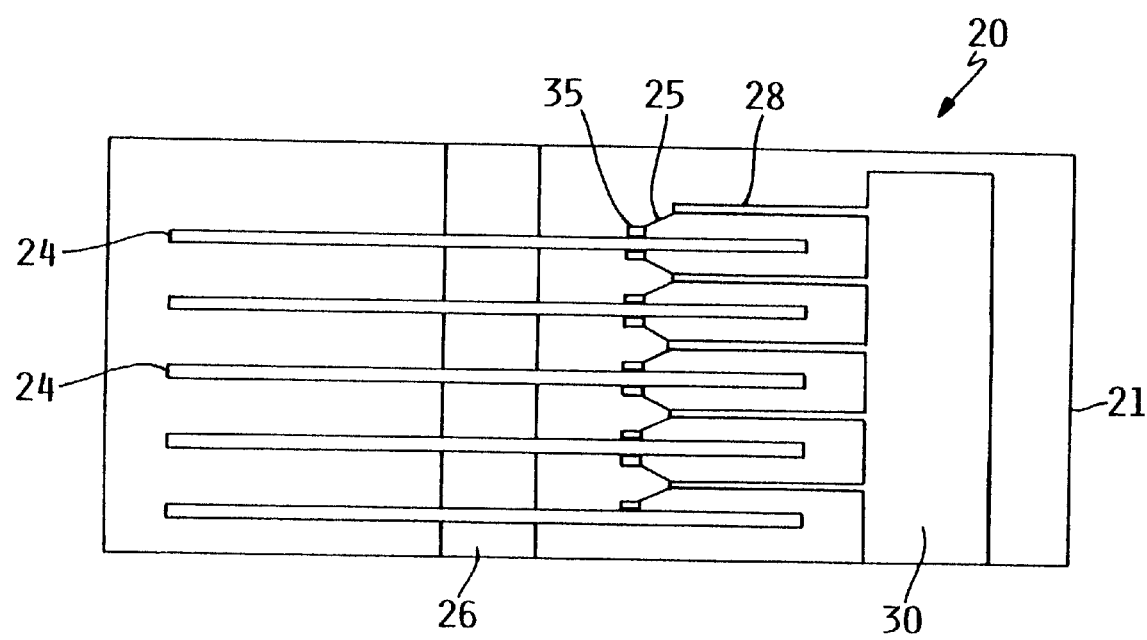
FIG. 2 is a side plan view of a disk drive system comprising a plurality of data storage disks.

Referring to the drawings, and more particularly to FIGS. 1 and 2, there is illustrated a disk drive system 20 within which the readback signal amplitude estimation methodology of the present invention may be implemented. The disk drive system 20, as is best shown in FIG. 2, typically includes one or more rigid data storage disks 24 which are stacked coaxially in a tandem spaced relationship, and rotate about a spindle motor 26 at a relatively high rate of rotation. As is depicted in FIG. 1, each disk 24 is typically formatted to include a plurality of spaced concentric tracks 50, with each track being partitioned into a series of sectors 52 which, in turn, are further divided into individual information fields. One or more of the disks 24 may alternatively be formatted to include a spiraled track configuration.

An actuator 30 typically includes a number of interleaved actuator arms 28 with each arm having one or more transducer 27 and slider assemblies 35 mounted to a load beam 25 for transferring information to and from the data storage disks 24. The slider 35 is typically designed as an aerodynamic lifting body that lifts the transducer 27 off the surface of the disk 24 as the rate of spindle motor rotation increases and causes the transducer 27 to hover above the disk 24 on an air bearing produced by high speed rotation of the disk 24. A conformal lubricant may alternatively be disposed on the disk surface 24 to reduce static and dynamic friction between the slider 35 and the disk surface 24.

The actuator 30 is typically mounted to a stationary actuator shaft 32 and rotates on the shaft 32 to move the actuator arms 28 into and out of the stack of data storage disks 24. A coil assembly 36, mounted to a coil frame 34 of the actuator 30, generally rotates within a gap 44 defined between the upper and lower magnet assemblies 40 and 42 of a permanent magnet structure 38 causing the actuator arms 28, in turn, to sweep over the surface of the data storage disks 24. The spindle motor 26 typically comprises a polyphase AC motor or, alternatively, a DC motor energized by a power supply 46 and adapted for rotating the data storage disks 24.

The coil assembly 36 and the upper and lower magnet assemblies 40 and 42 of the permanent magnet structure 38 operate in cooperation as an actuator voice coil motor 39 responsive to control signals produced by a servo processor 56. The servo processor 56 controls the direction and magnitude of control current supplied to the voice coil motor 39. The actuator voice coil motor 39 produces a torquing force on the actuator coil frame 34 when control currents of varying direction and magnitude flow in the coil assembly 36 in the presence of a magnetic field produced by the permanent magnet structure 38. The torquing forces imparted on the actuator coil frame 34 cause corresponding rotational movement of the actuator arms 28 in directions dependent on the polarity of the control currents flowing in the coil assembly 36.

The servo processor 56, which cooperates with read channel electronics 57, regulates the actuator voice coil motor 39 to move the actuator arms 28 and transducers 27 to prescribed track 50 and sector 52 locations when reading and writing data to and from the disks 24. The servo processor 56 is loosely coupled to a disk drive controller 58. The disk drive controller 58 typically includes control circuitry and software that coordinate the transfer of data to and from the data storage disks 24. Although the servo processor 56 and disk drive controller 58 are depicted as two separate devices in FIG. 1, it is understood that the functionality of the servo processor 56 and disk drive controller 58 may be embodied in a single multi-purpose processor, which typically results in a reduced component cost.

Figure 3:
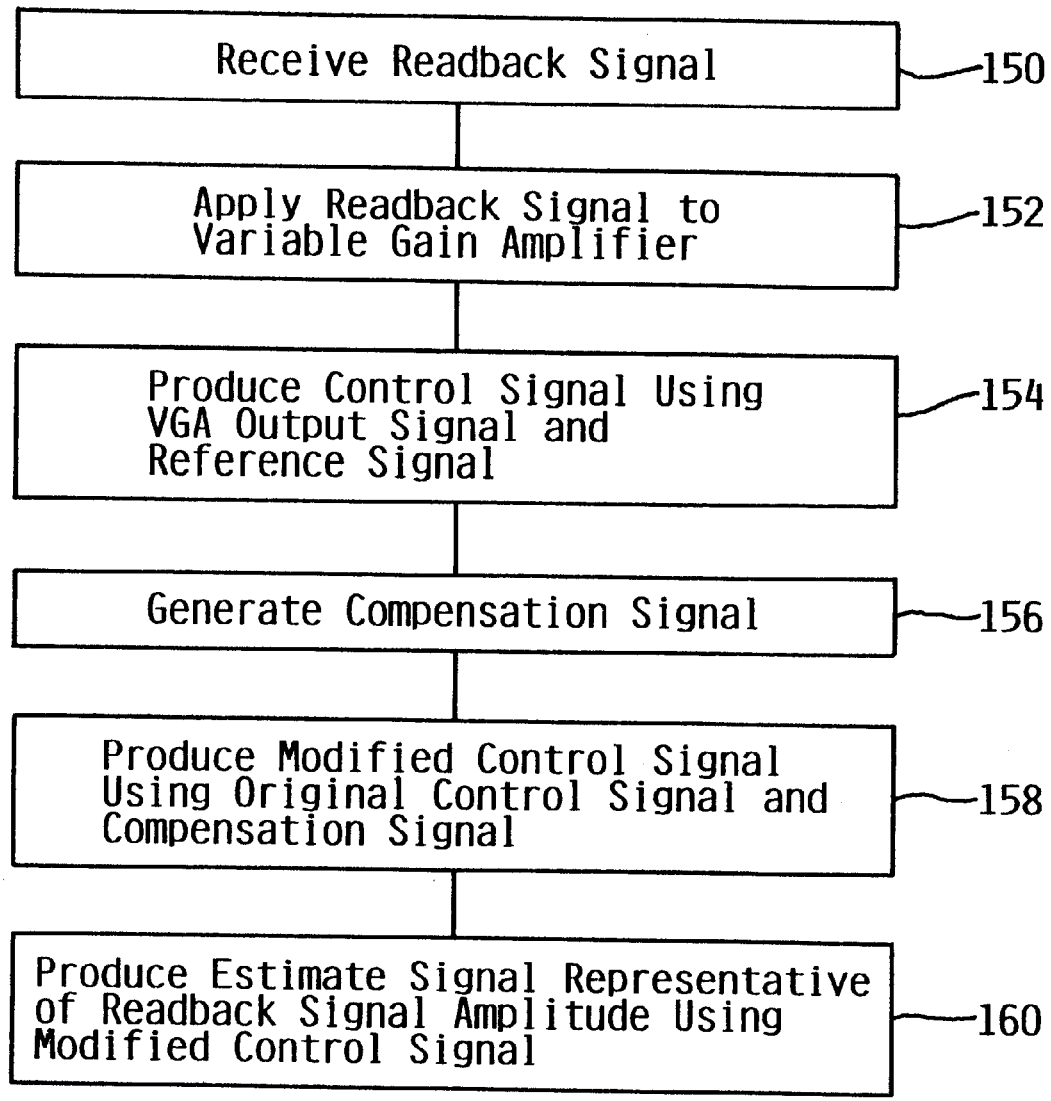
FIG. 3 is a flow diagram depicting several processes performed within a data storage system when estimating the amplitude of a readback signal obtained from a data storage medium in accordance with the principles of the present invention.

Turning now to FIG. 3, there is illustrated in flow diagram form various processes performed for purposes of estimating the amplitude of a signal read from a data storage medium in accordance with an embodiment of the present invention. As is shown in FIG. 3, a readback signal is obtained 150 from a data storage medium provided in a data storage system. In this embodiment, a variable gain amplifier (VGA) is employed in the automatic gain control (AGC) loop of a read channel for purposes of regulating the amplitude of the readback signal introduced into the signal processing path of the read channel. The readback signal is applied 152 to a signal input of the VGA. A control signal is produced 154 using the VGA output signal and a reference signal representative of a preestablished amplitude. The control signal is then applied to the control inputs of the VGA which typically results in an adjustment to the gain of the VGA.

A compensation signal is generated 156 which is related to a temperature coefficient of the VGA gain. In one embodiment, the magnitude or value of the compensation signal is proportionally related to absolute temperature. The compensation signal is used together with the original control signal to produce 158 a modified control signal. The modified control signal is used to produce 160 an estimate signal which is an accurate representation of the amplitude of the readback signal.

The estimate signal is a signal equivalent in value to the modified control signal, but may be in a form suitable for a variety of input or output needs. For example, the modified control signal may be an analog signal, and the estimate signal may be a digital signal representative of the analog modified control signal. A readback signal amplitude computed in accordance with the principles of the present invention accounts for temperature related variations in the VGA control signal due to the temperature coefficient of the VGA gain.

Figure 4:
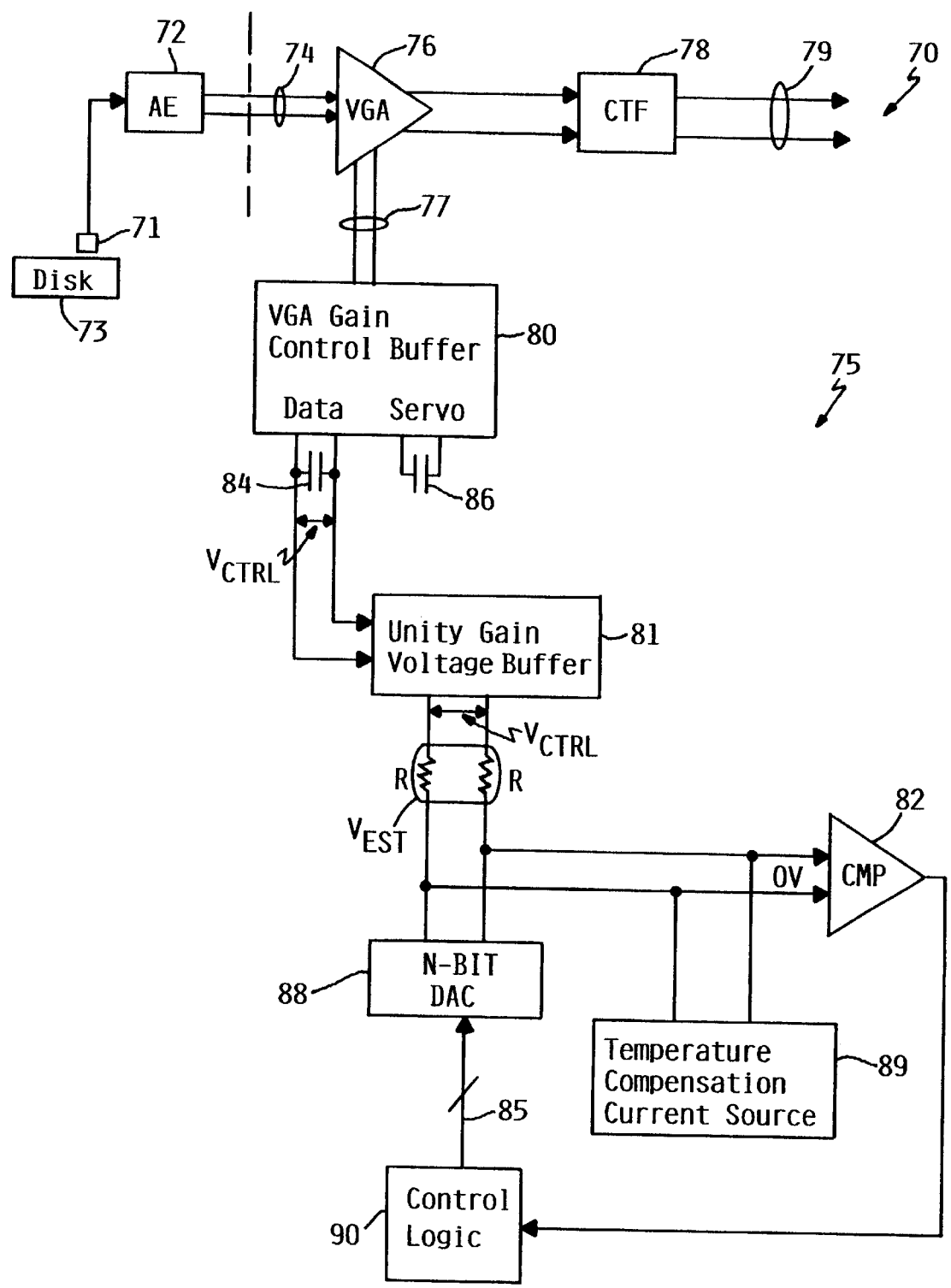
FIG. 4 is a block diagram of read channel circuitry including circuitry for estimating the amplitude of a readback signal in accordance with an embodiment of the present invention.

Referring now to FIG. 4, there is illustrated circuitry 70 for estimating the amplitude of a readback signal obtained from a data storage medium in accordance with an embodiment of the present invention. The circuitry 70 illustrated in FIG. 4 may be integrated within the read channel electronics of the system described previously with respect to FIGS. 1 and 2. It is understood that the circuitry 70 shown in FIG. 4, as well as other circuit embodiments and methodologies described herein, may be implemented in a wide variety of data storing systems and other types of signal processing systems in general.

FIG. 4 depicts a number of components that process information signals derived from a data storage disk 73 using the read element of a read/write head 71. The information signals obtained from the surface of disk 73 typically represent data or servo information stored thereon, but may include other types of information. The information stored on disk 73 is typically in the form of magnetic transitions on a series of concentric or serpentine tracks. The read/write head 71 may include a magnetoresistive (MR) read element, a giant magnetoresistive (GMR) read element, a thin-film read element, or other type of read transducer. It is understood that data storage disk 73 may store optical information, and that read/write head 71 may include an optical read element.

The information signal induced in the read transducer of read/write head 71 is typically communicated to preamplification electronics, such as an arm electronics (AE) circuit or module 72. The AE module 72 amplifies the readback signal transmitted from the read/write head 71, typically from the microvolt range to the millivolt range. The amplified readback signal is communicated from the AE module 72 to a readback signal amplitude estimating circuit 75. The readback signal amplitude estimating circuit 75 is preferably, but not necessarily, integrated within the read channel. It is noted that various components of circuit 75 are components typically employed in read channel applications. Such components may be coupled to other circuit elements which, in combination, provide for accurate readback signal amplitude estimates in accordance with the principles of the present invention.

In accordance with the embodiment illustrated in FIG. 4, the readback signal amplitude estimating circuitry 75 includes a variable gain amplifier (VGA) 76 which is coupled to the AE module 72 through one or more signal conductors 74. A variable gain amplifier is understood in the art as an amplifier having a gain that is alterable in response to control signals, such as current or voltage control signals. The VGA 76 is coupled to a continuous time filter (CTF) 78 in this embodiment through which readback signals are communicated and filtered. Readback signals output from CTF 78 are transmitted to downstream circuitry along one or more signal conductors 79.

In a preferred embodiment, VGA 76 is used to normalize the amplitude of the readback signal received from AE module 72. For example, the readback signal amplitude at the output of VGA 76 may be normalized at 800 mV$_{dpp}$ (peak-to-peak). In an embodiment that includes both VGA 76 and CTF 78, the normalized amplitude of interest is that associated with the combination of VGA 76 and CTF 78.

In accordance with the circuit configuration shown in FIG. 4, a VGA gain control buffer 80 produces control voltage signals which are transmitted along one or more conductors 77 to VGA 76 for purposes of adjusting the gain of VGA 76. The gain control buffer 80 includes a data gain capacitor 84 and a servo gain capacitor 86. The voltages developed respectively across gain capacitors 84, 86 are representative of integrated automatic gain control voltages. It will be appreciated that gain control buffer 80 may, in a less complex embodiment, be representative of a multiplexer.

The gain control buffer 80 is coupled to a unity gain voltage buffer 81. As is depicted in FIG. 4, a voltage equivalent to that developed across data gain capacitor 84 is provided at an input of unity gain voltage buffer 81. It is noted that the voltage associated with data gain capacitor 84 may be selectively applied to the input of unity gain voltage buffer 81 during either an idle mode or read mode of disk drive system operation.

The voltage developed at the output of unity gain voltage buffer 81, $V_{CTRL}$, is identical to that developed across data gain capacitor 84. Resistors, R, are connected to respective outputs of unity gain voltage buffer 81 and to an N-bit digital-to-analog converter (DAC) 88. The outputs of N-bit DAC 88 and resistors, R, are also coupled to the inputs of the comparator 82. A temperature compensation current source 89 is coupled to respective inputs of comparator 82.

It is noted that the unity gain voltage buffer 81, N-Bit DAC 88, and comparator 82 are connected as shown in FIG. 4 for purposes of performing a readback signal amplitude estimation procedure in accordance with the principles of the present invention, which will be discussed in detail hereinbelow with further reference to FIGS. 4, 6, and 7. These connections are typically changed to provide for other functionality during other modes of disk drive system operation.

As was briefly discussed hereinabove, many disk drive systems employ read channels that use an automatic gain control (AGC) loop to regulate the amplitude of the readback signal introduced into the signal processing path of the read channel. Regulating the readback signal amplitude at a preestablished amplitude is generally needed to accommodate differences in head/channel characteristics due to manufacturing variations, fly height variations, preamplifier gain variations, and the like.

Figure 5:
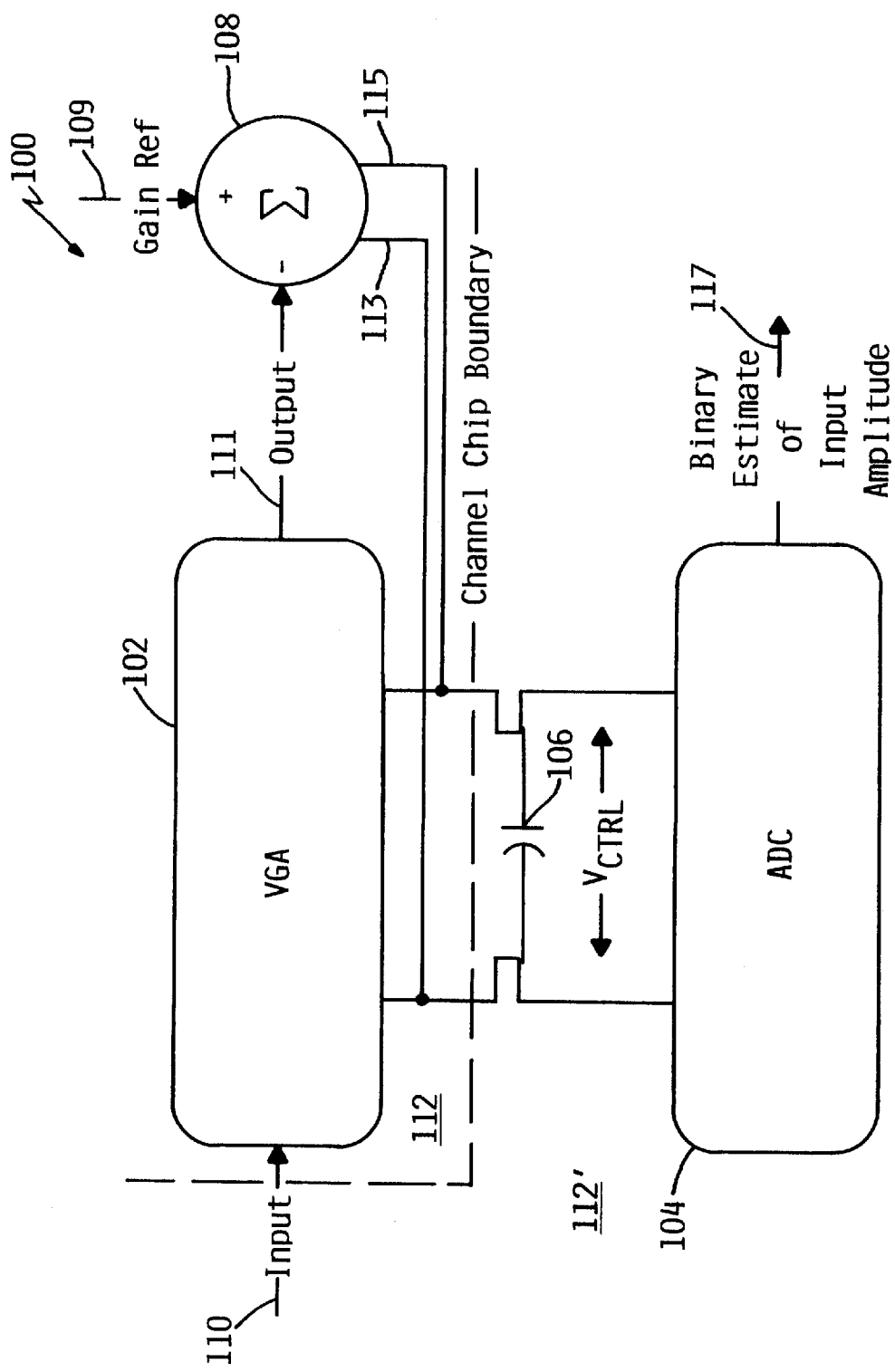
FIG. 5 is a block diagram of an approach to estimating the amplitude of a readback signal in accordance with a known technique.

In accordance with a known implementation, such as that depicted in FIG. 5, a readback signal is received at an input 110 of a variable gain amplifier 102. The AGC loop functions by sensing the amplitude of the readback signal at an output 111 of VGA 102, and comparing the readback signal amplitude to a preestablished gain reference signal 109, such as by use of a comparator 108. An error signal of the appropriate magnitude and sign is generated by comparator 108 in response to a difference detected between the gain reference signal 109 and the readback signal provided at the output 111 of VGA 102. The error signal, also referred to as a VGA control signal, $V_{CTRL}$, is applied to VGA 102 via conductors 113, 115 so as to increase or decrease the VGA gain until the amplitude of the readback signal applied to comparator 108 is equivalent to that of the gain reference signal 109.

Since the desired output level of the readback signal is fixed, it would appear straightforward to use the VGA control signal, $V_{CTRL}$, to estimate the amplitude of the readback signal applied to the input 110 of VGA 102. However, this conclusion would erroneously assume that the gain of VGA 102 is a function only of the VGA control voltage, $V_{CTRL}$. In reality, however, it is understood in the art that the gain of a typical integrated VGA 102 is dependant on temperature. For example, temperature will vary in any given channel component depending on data rate, mode of operation, and the environment within which the particular system is operated. Thus, for a given channel component, the same VGA control voltage will produce a different VGA gain as the temperature varies.

Further, the effects of temperature on the AGC loop may cause the loop to lock with different values of VGA control signal input, even where the amplitude of the readback signal applied to the input 110 of VGA 102 is unchanged. Process shifts will also affect the gain between different read channel modules. Thus, the same VGA control voltage will result in different VGA gain values between different read channel modules. These factors reduce the correlation between VGA control signal values, $V_{CTRL}$, and readback signal amplitude values.

Techniques have been developed to estimate the amplitude of a readback signal input to a VGA using VGA control signals, $V_{CTRL}$. FIG. 5 illustrates in block diagram form one such conventional approach. Such techniques, however, wholly ignore the adverse effects of temperature variation on readback signal amplitude, and, as a consequence, suffer from reduced accuracy because the temperature coefficient of the read channel VGA gain is not taken into account. Ignoring temperature related effects during VGA control signal generation results in various inaccuracies that negatively impact the accuracy of readback signal amplitude estimates.

For example, and with further reference to FIG. 5, VGA 102 is shown coupled to an analog-to-digital converter (ADC) 104, a comparator 108, and a data gain capacitor 106. The voltage across integrating data gain capacitor 106, which is representative of a VGA control signal, $V_{CTRL}$, is applied to ADC 104. ADC 104 digitizes the data gain capacitor voltage and stores digitized voltage values in a memory via ADC output 117. The value of the digital signal provided at output 117 of ADC 104 is a non-temperature compensated, binary estimate of the amplitude of the readback signal applied to the input 110 of VGA 102.

VGA 102 is depicted as residing on an integrated circuit (IC) substrate, or chip, physically distinct from that on which ADC 104 resides. As such, VGA 102 may, and often does, have a temperature that differs from that of ADC 104. It has been found that comparator 108 produces differing digital control codes for the same amplitude level of a readback signal input to VGA 102 if the channel chip 112 is at a temperature different from that of the chip 112' on which digitization is performed by ADC 104.

Such temperature related effects, if ignored, causes the AGC loop to lock with different values of VGA control input even if the amplitude of the readback signal input to the VGA is unchanged. It can be appreciated that ignoring temperature related effects during VGA control signal generation reduces the accuracy of a readback signal amplitude estimation approach, such as is described above with reference to FIG. 5, and may even result in false indications of read/write head integrity.

Referring again to FIG. 4, and as discussed above, a VGA control voltage signal, $V_{CTRL}$, is developed across the outputs of unity gain voltage buffer 81. As was further discussed above, a typical prior art approach involves using only the VGA control voltage signal, $V_{CTRL}$, for purposes of estimating the amplitude of a readback signal applied to the input of VGA 76. Such an approach, however, ignores temperature related factors that cause the VGA control voltage signal, $V_{CTRL}$, to change as VGA gain changes as a function of temperature. It can be seen, therefore, that a readback signal amplitude estimate that is based solely on the VGA control voltage signal, $V_{CTRL}$, will also change as a function of temperature, notwithstanding that the amplitude of the readback signal input to the VGA 76 is unchanging.

A readback signal amplitude estimation approach consistent with the principles of the present invention involves using the VGA control voltage signal, $V_{CTRL}$, in conjunction with an estimate signal, $V_{EST}$, which is developed across resistors, R, to produce a temperature compensated estimate of the amplitude of a readback signal applied to the input of VGA 76. A temperature compensation current source 89 produces a current such that a voltage, $V_{EST}$, is developed across resistors, R. The voltage, $V_{EST}$, is developed across resistors, R, such that $V_{EST}$ is equal in magnitude to the VGA control voltage signal, $V_{CTRL}$, but opposite in polarity. It is noted that the output of N-bit DAC 88 does not change during the time in which the temperature compensation current source 89 supplies current to resistors, R.

Comparator 82 changes state in response to the production of a zero volt potential across the inputs of comparator 82 (i.e., $V_{CTRL}-V_{EST}=0$). At this point of equivalency between the voltages $V_{CTRL}$ and $V_{EST}$, the value $V_{EST}$ accurately represents the amplitude of the readback signal applied to VGA 74. It can be appreciated that fluctuations in the VGA control voltage signal, $V_{CTRL}$, due to temperature variations are thus compensated for by the production of a temperature compensated (i.e., modified) VGA control signal, $V_{EST}$, in accordance with the principles of the present invention.

Figure 6:
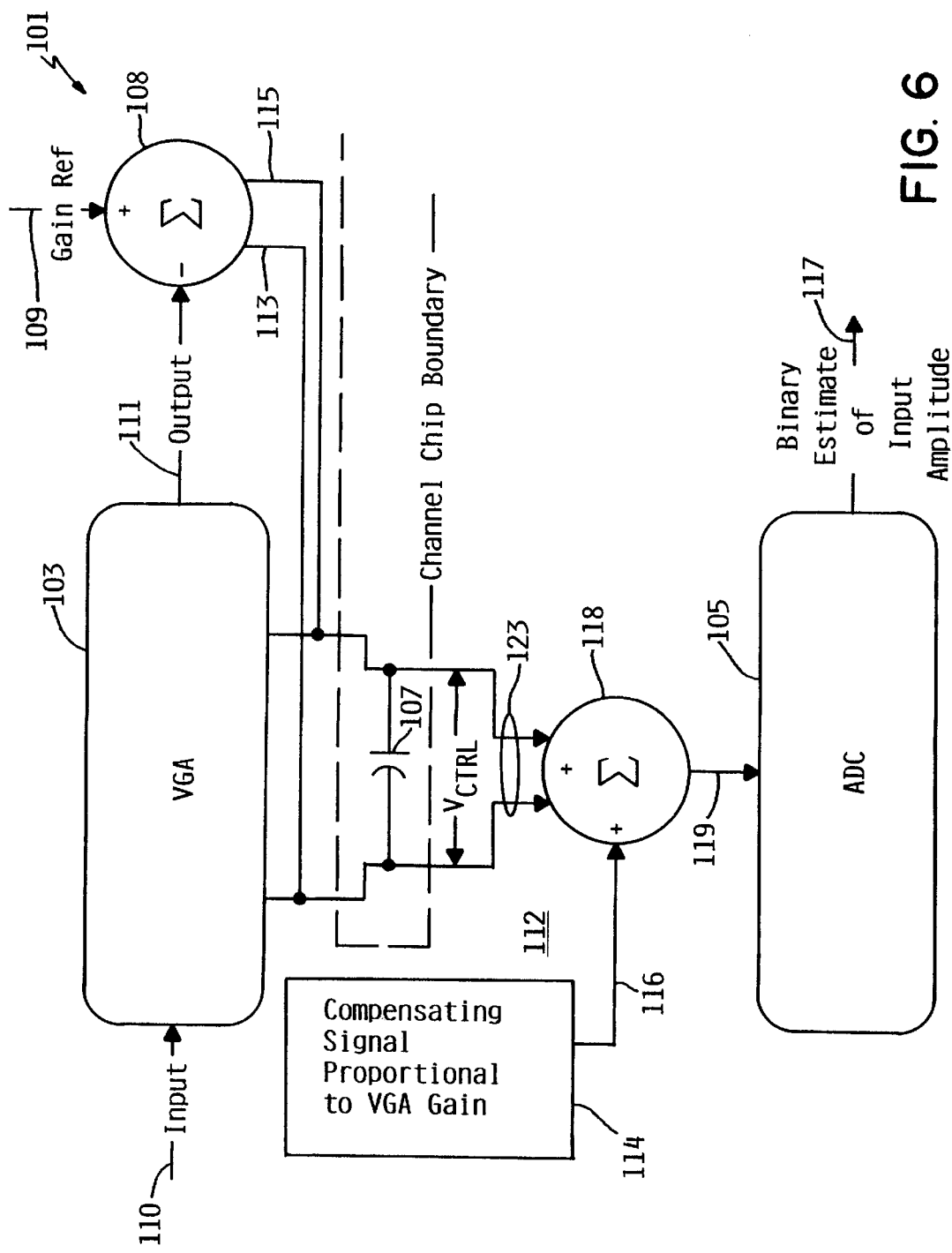
FIG. 6 is a block diagram of an apparatus for estimating the amplitude of a readback signal in accordance with an embodiment of the present invention.

Turning now to FIG. 6, there is illustrated a readback signal amplitude estimating circuit 101 in accordance with an embodiment of the present invention. In accordance with this embodiment, a VGA control signal 123 is used in combination with a compensation signal 116 for purposes of estimating the amplitude of a readback signal applied to the input 110 of VGA 103. In particular, a compensation signal 116 is produced which is associated with a temperature coefficient of the VGA gain.

The compensation signal 116 is applied to a summing device 118 which adds/subtracts the compensation signal 116 to/from the VGA control signal, $V_{CTRL}$, 123 so as to produce a modified VGA control signal 119, $V_{EST}$. The modified VGA control signal, $V_{EST}$, 119 is input to ADC 105. ADC 105 digitizes the modified VGA control signal, $V_{EST}$, 119 and provides the digitized signal 119 to an output 117 of ADC 105. The signal provided at ADC output 117 is a temperature compensated, binary estimate of the amplitude of the readback signal applied to the input 110 of VGA 103.

As can further be seen in FIG. 6, ADC 105 is integrated on the same IC substrate 112 as that on which VGA 103 resides. In this configuration, the compensation signal generating circuitry 114, which will be described below in greater detail with reference to FIG. 7, is contained on the same chip 112 as VGA 103. As such, the compensation signal generating circuitry 114, VGA 103, and ADC 105, all of which reside on a common IC substrate 112, have an equivalent temperature profile. A significant advantage realized through integrating the compensation signal generating circuitry 114, VGA 103, and ADC 105 on a common IC substrate 112 concerns the ability to track or anti-track the VGA gain/temperature function as needed. Accounting for the temperature coefficient associated with the VGA gain/VGA control signal relationship in a manner consistent with the principles of the present invention advantageously increases the accuracy of readback signal amplitude estimates.

Figure 7:
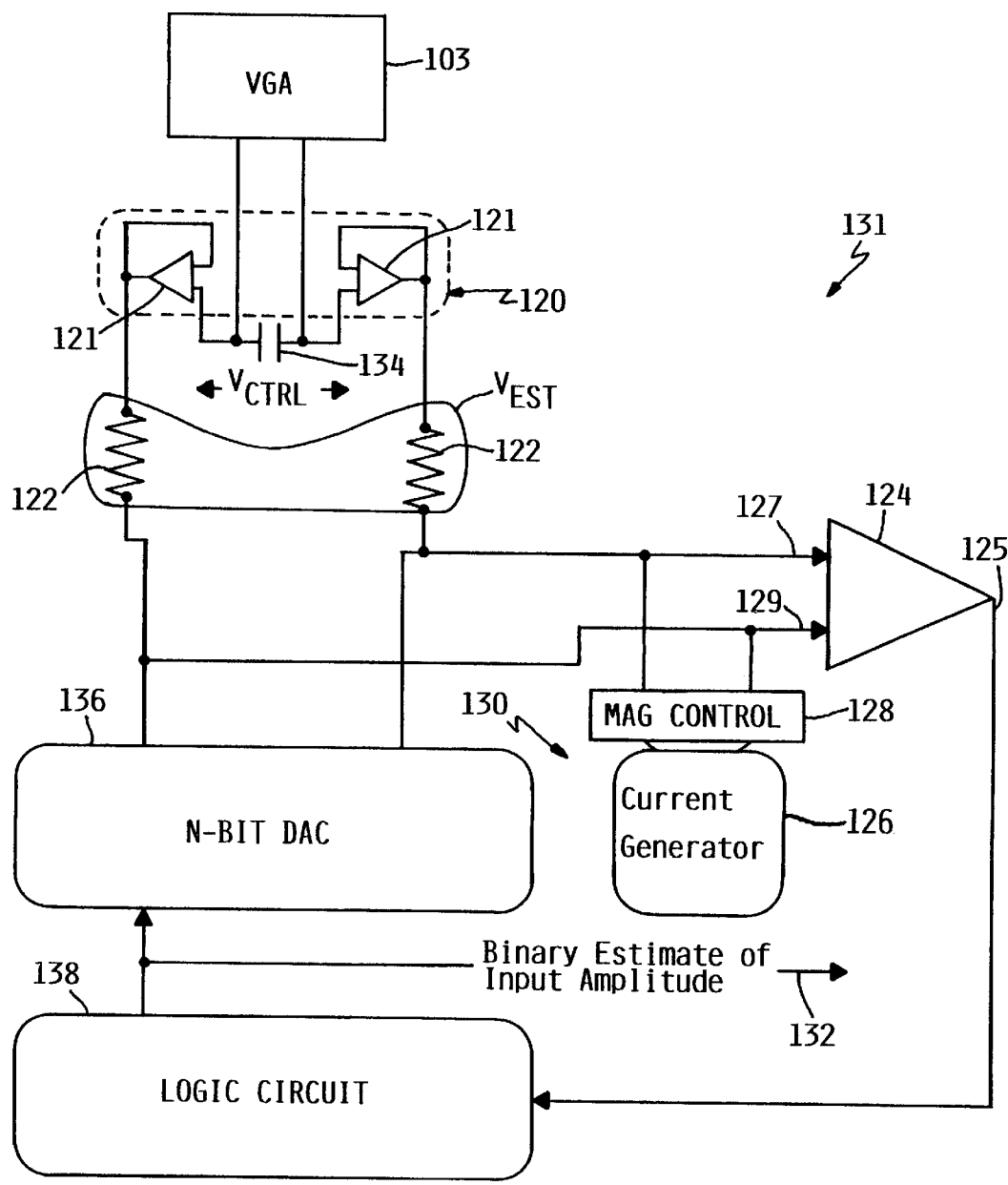
FIG. 7 is a circuit diagram of an apparatus for estimating the amplitude of a readback signal in accordance with another embodiment of the present invention.

With particular reference to FIG. 7, there is illustrated circuitry 131 for estimating the amplitude of a readback signal in accordance with another embodiment of the present invention. The circuitry 131 depicted in FIG. 7 includes VGA 103, unity gain voltage buffer circuitry 120, (shown in dashed lines), control logic 138, an N-bit DAC 136 coupled to control logic 138, a comparator 124, and temperature compensation circuitry 130. Control logic 138 may be integral to the disk drive controller 58 shown in FIG. 1. A data gain capacitor 134 is coupled to a pair of resistors 122 via a pair of buffers 121. As was previously discussed, data gain capacitor 134 stores a voltage which is representative of the read channel's VGA control signal, $V_{CTRL}$. Buffers 121 are preferably unity gain type buffers, and may be configured as source followers or emitter followers.

Temperature compensation circuitry 130 may be integrated within VGA 103 or unity gain voltage buffer circuitry 120. Alternatively, temperature compensation circuitry 130 may be separate from the VGA 103 or unity gain voltage buffer circuitry 120. The unity gain voltage buffer circuitry 120, N-bit DAC 136, comparator 124, and temperature compensation circuitry 130 are preferably provided on a common IC substrate or chip. VGA 103 and control logic 138 may be provided on the common IC substrate for integration purposes or on a substrate/chip separate from the common IC substrate. Data gain capacitor 134 is typically, but not necessarily, provided external to the read channel, such as on a substrate separate from the common IC substrate.

Processing of readback signals by the readback signal amplitude estimating circuitry 131 depicted in the embodiment of FIG. 7 is preferably performed in current mode. In this configuration, the compensation signal produced by the temperature compensation circuitry 130 is a current having a value that is related to temperature. In one embodiment, the compensation signal is a current having a value that is proportionally related to absolute temperature.

VGA 103, in accordance with a preferred embodiment, is of a modified Gilbert-cell design, and exhibits gain characteristics which are determined empirically to be proportional to absolute temperature. In an embodiment in which the temperature compensation circuitry 130 is integrated within VGA 103, currents that are proportionally related to absolute temperature are produced within VGA 103 and may be copied by use of current mirrors for employment by the temperature compensation circuitry 130.

In operation, a modified VGA control signal, $V_{EST}$, is subtracted from the buffered VGA control signal, $V_{CTRL}$, and applied to comparator inputs 127, 129 of comparator 124. The modified VGA control signal, $V_{EST}$, represents the differential voltage generated across resistors 122 by currents supplied by N-bit DAC 136 and the temperature compensation circuitry 130. The temperature compensation circuitry 130 selectively produces a first compensation signal, which is temperature compensated so as to track the VGA gain/temperature relationship, and a second compensation signal, which is a non-temperature compensated signal (i.e., temperature independent signal). Producing these two compensation signals advantageously permits either positive or negative compensations to be effected.

As is further shown in FIG. 7, a compensation signal is produced by current generator 126 of the temperature compensation circuitry 130. A compensation control 128 may be adjusted to change the magnitude of the compensation signal produced by current generator 126. The compensation signal produced by current generator 126 may be a positive current signal or a negative current signal depending on the polarity of the VGA control signal, $V_{CTRL}$. In short, the compensation signal is produced to have a magnitude and polarity such that $V_{EST}$ is added/subtracted to/from the VGA control signal to achieve the desired cancellation, such that the voltage states at inputs 127 and 129 of comparator 124 are equivalent (i.e., 0 volts). At this point of voltage equivalency at comparator inputs 127, 129, an estimate signal 132 is provided at an output of control logic 138. Estimate signal 132 is a temperature compensated binary signal produced using the modified VGA control signal, $V_{EST}$, and is an accurate representation of the amplitude of the readback signal input to VGA 103.

In one embodiment, control logic 138 is implemented as a counter that drives an integral digital-to-analog converter (DAC), which is shown in FIG. 7 as a current output N-bit DAC 136. The counter may be a successive-approximation type counter, a binary counter, such as a binary up/down counter, or other type of counter. In operation, control logic 138 sends binary codes to N-bit DAC 136 until comparator 124 changes state, thus indicating a zero volt potential across inputs 127, 129 of comparator 124. In one embodiment, the range of comparator 124 may be minimized by subtracting the modified VGA control signal, $V_{EST}$, from the buffered control voltage signal, $V_{CTRL}$. Using this approach, comparator 124 may be implemented using a traditional zero-crossing detector as an alternative to a more complex and typically less accurate programmable threshold differential comparator.

The foregoing description of the various embodiments of the invention has been presented for the purposes of illustration and description. It is not intended to be exhaustive or to limit the invention to the precise form disclosed. For example, the readback signal amplitude estimating circuitry of the present invention may process readback signals in voltage mode as an alternative to operating in current mode. Many modifications and variations are possible in light of the above teaching. It is intended that the scope of the invention be limited not by this detailed description, but rather by the claims appended hereto.

What is claimed is:

1. A method of estimating an amplitude of a readback signal obtained from a data storage medium and input to a gain modifying amplifier, the method comprising:
    sensing an output signal at an output of the amplifier in response to the readback signal applied to an input of the amplifier;
    producing a difference signal representative of a difference between the amplifier output signal and a reference signal;
    generating a compensation signal associated with a temperature coefficient of the amplifier gain; and
    producing an estimate signal using the compensation signal such that the estimate signal has a magnitude equivalent to that of the difference signal, the estimate signal indicative of the amplitude of the readback signal.

2. The method of claim 1, wherein producing the estimate signal comprises adding the estimate signal to the difference signal or subtracting the estimate signal from the difference signal.

3. The method of claim 1, wherein the compensation signal has a magnitude related to temperature.

4. The method of claim 1, wherein the compensation signal has a magnitude proportional to absolute temperature.

5. The method of claim 1, wherein generating the compensation signal further comprises generating a first compensation signal having a magnitude proportional to absolute temperature and generating a second compensation signal having a magnitude independent of temperature.

6. The method of claim 5, wherein the first compensation signal has a polarity opposite that of the second compensation signal.

7. The method of claim 1, wherein the estimate signal is converted to a binary estimate signal.

8. The method of claim 1, wherein the compensation signal is a current signal.

9. The method of claim 1, wherein a magnitude of the compensation signal is adjustable.

10. The method of claim 1, further comprising applying the difference signal to a control input of the amplifier so as to equilibrate the amplifier output signal with the reference signal.

11. The method of claim 10, wherein the reference signal is representative of a preestablished readback signal amplitude.

12. A circuit for estimating an amplitude of a read back signal obtained from a data storage medium, the circuit comprising:
    a gain modifying amplifier having a signal input, a signal output, and control inputs that receive an amplifier control signal, the signal input of the amplifier receiving the readback signal;
    a comparator having inputs coupled to the control inputs of the amplifier via respective resistive elements;
    a digital-to-analog circuit (DAC) having outputs coupled to the comparator inputs;
    a temperature compensation circuit coupled to the comparator inputs, the temperature compensation circuit generating a compensation signal associated with a temperature coefficient of amplifier gain and causing a change in voltage across the resistive elements; and
    a logic circuit having an input coupled to the output of the comparator and an output coupled to an input of the DAC, the logic circuit producing at the logic circuit output an estimate signal indicative of the amplitude of the readback signal in response to equivalency of voltages at the respective inputs of the comparator.

13. The circuit of claim 12, wherein the amplifier, temperature compensation circuit, and comparator have an equivalent temperature profile.

14. The circuit of claim 12, wherein the amplifier, temperature compensation circuit, and comparator are provided on a common IC substrate.

15. The circuit of claim 12, wherein the temperature compensation circuit is integral to the amplifier.

16. The circuit of claim 12, wherein the amplifier comprises a variable gain amplifier (VGA), and the DAC comprises an N-bit current DAC.

17. The circuit of claim 12, wherein the logic circuit produces a binary estimate signal at the logic circuit output.

18. The circuit of claim 12, wherein the temperature compensation circuit comprises a current generator and a magnitude control.

19. The circuit of claim 12, wherein the control inputs of the amplifier are coupled to a capacitor, and the amplifier control signal is stored in the capacitor.

20. The circuit of claim 12, wherein temperature compensation circuit generates a first compensation signal having a magnitude proportional to absolute temperature and generates a second compensation signal having a magnitude independent of temperature.

21. The circuit of claim 20, wherein the first compensation signal has a polarity opposite that of the second compensation signal.

22. The circuit of claim 12, wherein the compensation signal is a current signal.

23. A data storing system, comprising:

a data storage disk;

a data transfer head including a read transducer coupled to a read channel;

an actuator for providing relative movement between the head and the disk; and a circuit for estimating an amplitude of a readback signal obtained from the data storage disk using the data transfer head, the circuit comprising:

a gain modifying amplifier having a signal input, a signal output, and control inputs that receive an amplifier control signal, the signal input of the amplifier receiving the readback signal;

a comparator having inputs coupled to the control inputs of the amplifier via respective resistive elements;

a digital-to-analog circuit (DAC) having outputs coupled to the comparator inputs;

a temperature compensation circuit coupled to the comparator inputs, the temperature compensation circuit generating a compensation signal associated with a temperature coefficient of amplifier gain and causing a change in voltage across the resistive elements; and a logic circuit having an input coupled to the output of the comparator and an output coupled to an input of the DAC, the logic circuit producing at the logic circuit output an estimate signal indicative of the amplitude of the readback signal in response to equivalency of voltages at the respective inputs of the comparator.

24. The system of claim 23, wherein the amplifier, temperature compensation circuit, and comparator have an equivalent temperature profile.

25. The system of claim 23, wherein the amplifier, temperature compensation circuit, and comparator are provided on a common IC substrate.

26. The system of claim 23, wherein the amplifier comprises a variable gain amplifier (VGA), and the DAC comprises an N-bit current DAC.

27. The system of claim 23, wherein the logic circuit produces a binary estimate signal at the logic circuit output.

28. The system of claim 23, wherein the temperature compensation circuit comprises a current generator and a magnitude control.

29. The system of claim 23, wherein the control inputs of the amplifier are coupled to a capacitor, and the amplifier control signal is stored in the capacitor.

30. The system of claim 23, wherein temperature compensation circuit generates a first compensation signal having a magnitude proportional to absolute temperature and generates a second compensation signal having a magnitude independent of temperature.

31. The system of claim 30, wherein the first compensation signal has a polarity opposite that of the second compensation signal.

* * * * *